US007013120B2

(12) United States Patent
Gilmore

(10) Patent No.: US 7,013,120 B2
(45) Date of Patent: Mar. 14, 2006

(54) WALKING WEAVER IMAGE REJECT MIXER FOR RADIO

(75) Inventor: Robert P. Gilmore, Poway, CA (US)

(73) Assignee: Intel Corporation, Santa Clara, CA (US)

( * ) Notice: Subject to any disclaimer, the term of this patent is extended or adjusted under 35 U.S.C. 154(b) by 649 days.

(21) Appl. No.: 10/043,746

(22) Filed: Jan. 8, 2002

(65) Prior Publication Data

US 2003/0129955 A1 Jul. 10, 2003

(51) Int. Cl.
*H04B 1/10* (2006.01)
(52) U.S. Cl. ............... 455/285; 455/349; 455/350; 455/375
(58) Field of Classification Search ........... 455/285, 455/349, 350, 375
See application file for complete search history.

(56) References Cited

U.S. PATENT DOCUMENTS 6,148,181 A * 11/2000 Otaka .................. 455/86

6,754,508 B1 * 6/2004 Pau .................... 455/552.1

OTHER PUBLICATIONS

Donald K. Weaver, Jr., A Third Method of Generation and Detection of Single-Sideband Signals, Proceedings of the IRE, vol. 44, No. 12, Published on Dec., 1956, pp. 1703-1705, The Institute of Radio Engineers, Inc.

* cited by examiner

*Primary Examiner*—Ahmad F. Matar
*Assistant Examiner*—Quynh H. Nguyen
(74) *Attorney, Agent, or Firm*—James S. Finn

(57) ABSTRACT

Methods and apparatus for implementing image rejection in radio receivers or transmitters includes a Weaver image reject mixer modified so that only one local oscillator is used for the highest mixing frequency, and subsequent lower frequency mixing signals fed to the mixers are derived from digital frequency divider networks which produce both in-phase and quadrature versions of their pre-determined output frequencies. By using frequency dividers to generate these subsequent lower frequency signals, the intermediate frequencies walk; and when these frequency dividers are set to divide by multiples of two, generating quadrature signals becomes straightforward.

38 Claims, 8 Drawing Sheets

WALKING WEAVER IMAGE REJECT MIXER FOR RADIO

BACKGROUND OF THE INVENTION

1. Field of the Invention

The present invention relates generally to the field of wireless communication, and more particularly relates to methods and apparatus for rejecting an image.

2. Background Information

Advances in semiconductor manufacturing processes have resulted in the production of integrated circuits having many millions of transistors as well as other active and passive components. The same advances that have provided the reduction in physical dimensions necessary to integrate millions of electrical elements on a single chip, also provide dramatic increases in operating frequency for these integrated circuits. Integrated circuits implementing logic functions now commonly operate at several GHz, with an order of magnitude increase in operating frequency expected in a few years.

The miniaturization of physical dimensions, coupled with the increase in functionality made possible by such advances in semiconductor technology have also led to the rapid growth of numerous classes of electronic products, many of which can benefit from the capability of wireless communication. Examples include, but are not limited to, computers, personal digital assistants, cellular telephones, and many others, all which may benefit from wireless access to one or more communication networks. Wireless communication of this sort includes a wide variety of applications, and therefore there has been a corresponding growth in radio standards to accommodate these applications. With the proliferation of radio networks and services associated with these multiple standards, it becomes desirable to have an electronic product enabled to simultaneously operate with two or more of these standards. For example, it would be advantageous for a product to simultaneously communicate in accordance with the Bluetooth radio standard and with either the IEEE 802.11b (2 GHz) or with IEEE 802.11a (5 GHz) radio standards.

Many of the electronic products that can benefit from wireless communication fall into the category of consumer electronic devices. One concern for manufacturers of consumer electronic products is cost. In order to provide a low bill of materials for consumer products capable of taking advantage of two or more of the radio standards mentioned above, it is desirable to integrate as much of this radio functionality as possible into an integrated circuit generally, and into a single integrated circuit particularly. Chip size, power consumption, and interference are concerns when integrating an increased number of radio functions onto a single chip.

What is needed are methods and apparatus for implementing multiple radio standards in an integrated circuit.

SUMMARY OF THE INVENTION

Briefly, methods and apparatus are provided in accordance with the present invention in which implementing image rejection in radio receivers or transmitters includes providing a Weaver image reject mixer modified so that only one local oscillator is used for the highest mixing frequency, and subsequent lower frequency mixing signals fed to the mixers are derived from digital frequency divider networks which produce both in-phase and quadrature versions of their pre-determined output frequencies. By using frequency dividers to generate these subsequent lower frequency signals, the intermediate frequencies walk; and when these frequency dividers are set to divide by multiples of two, generating quadrature signals becomes straightforward.

BRIEF DESCRIPTION OF THE DRAWINGS

The present invention is described herein by way of exemplary embodiments, but not limitations, illustrated in the accompanying drawings in which like references denote similar elements.

DETAILED DESCRIPTION

In the following description, various aspects of the present invention will be described. However, it will be apparent to those skilled in the art, that the present invention may be practiced with only some, or with all aspects of the present invention. For purposes of explanation, specific numbers, materials and configurations are set forth in order to provide a thorough understanding of the present invention. However, it will also be apparent to those skilled in the art, that the present invention may be practiced without one or more of those specific details. In other instances, well-known features are omitted or simplified in order not to obscure the present invention.

Reference herein to "one embodiment", "an embodiment", or similar phrases or formulations, means that a particular feature, structure, or characteristic described in connection with the embodiment, is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Figure 1:
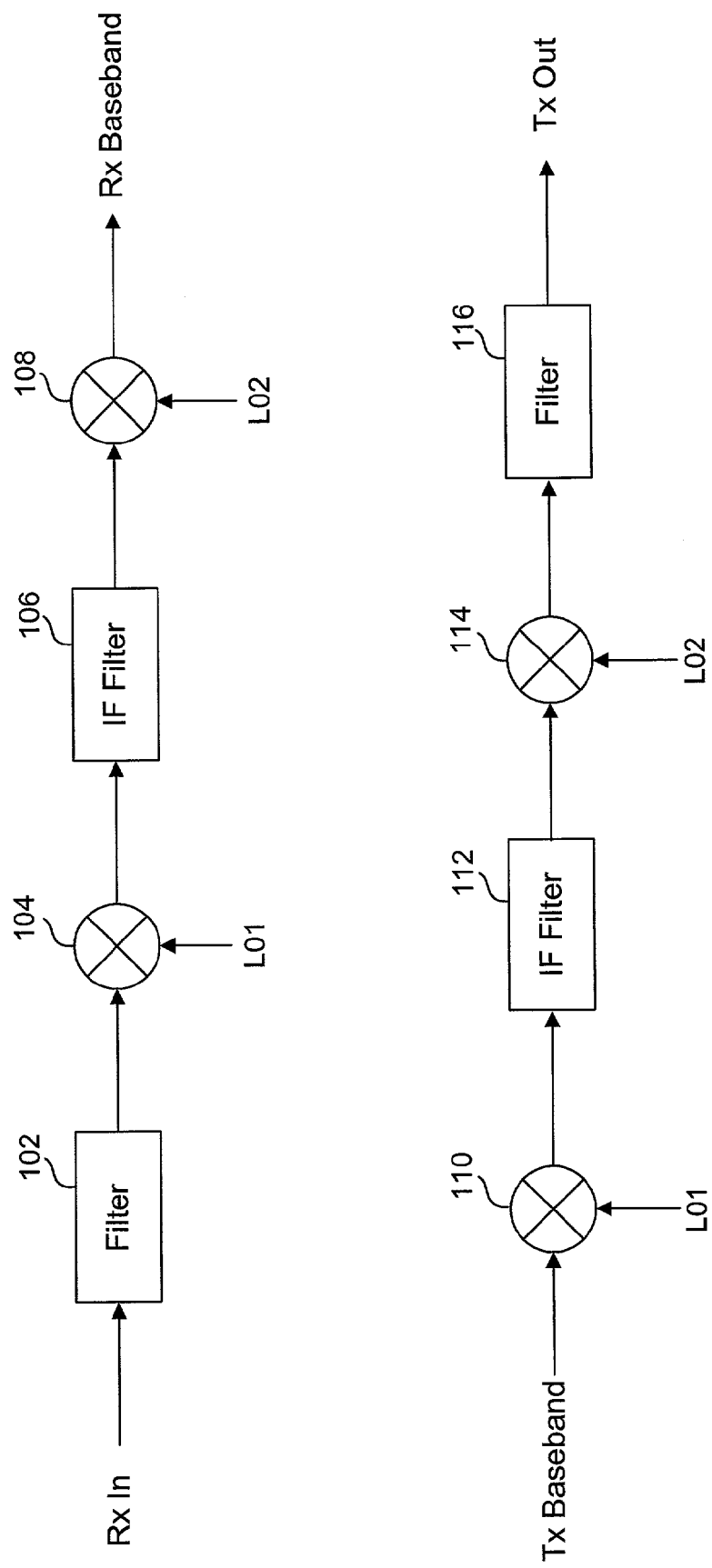
FIG. 1 is a circuit block diagram of a conventional superheterodyne radio architecture for receiver and transmitter paths that include filters for image rejection.

Conventionally, superheterodyne receivers or transmitters reject an image using filters. However, in an effort to design a radio such that it may be implemented in a single chip, it is desired to eliminate the external filters traditionally used in such superheterodyne implementations. FIG. 1 is a circuit block diagram of a conventional superheterodyne radio architecture for receiver and transmitter paths that include filters for image rejection. On the receive side, an input signal (Rx In) is passed through filter 102, the output of which is coupled to mixer 104, where the output of filter 102 is mixed with the output of a first local oscillator. The output of mixer 104 is passed through IF filter 106, the output of which is coupled to mixer 108, where the output of IF filter 106 is mixed with the output of a second local oscillator. The output of mixer 104 is the desired receiver baseband signal. Similarly, on the transmit side, an input signal (Tx Baseband) is coupled to a mixer 110, where it is mixed with the output of a first local oscillator. The output of mixer 110 is passed through IF filter 112, and the output of filter 112 is coupled to mixer 114 to be mixed with the output of a second local oscillator. The output of mixer 114 is passed through filter 116 to become the desired output signal (Tx Out). The first and second local oscillators for the receive path are not necessarily the same as the first and second local oscillators for the transmit path.

Figure 2:
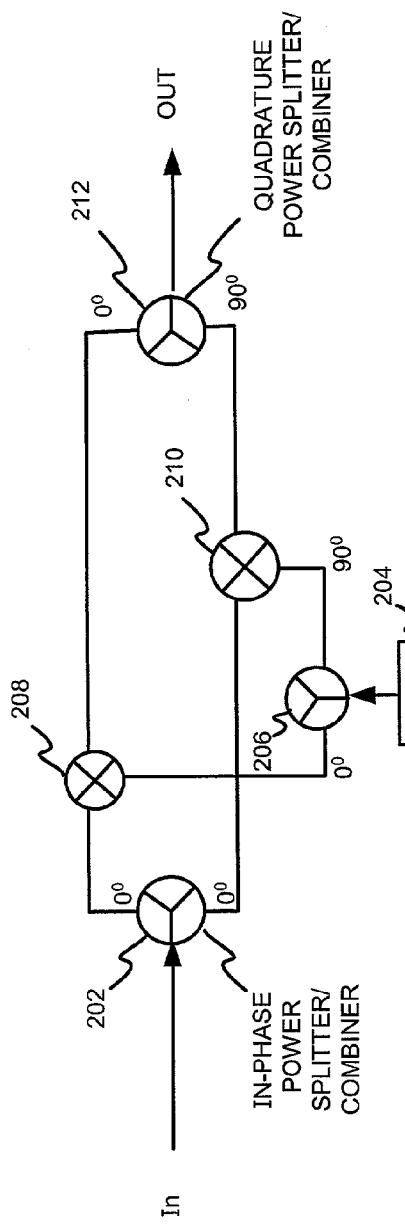
FIG. 2 is a circuit block diagram of an alternative radio architecture that uses mixers to reject an image.
Figure 3:
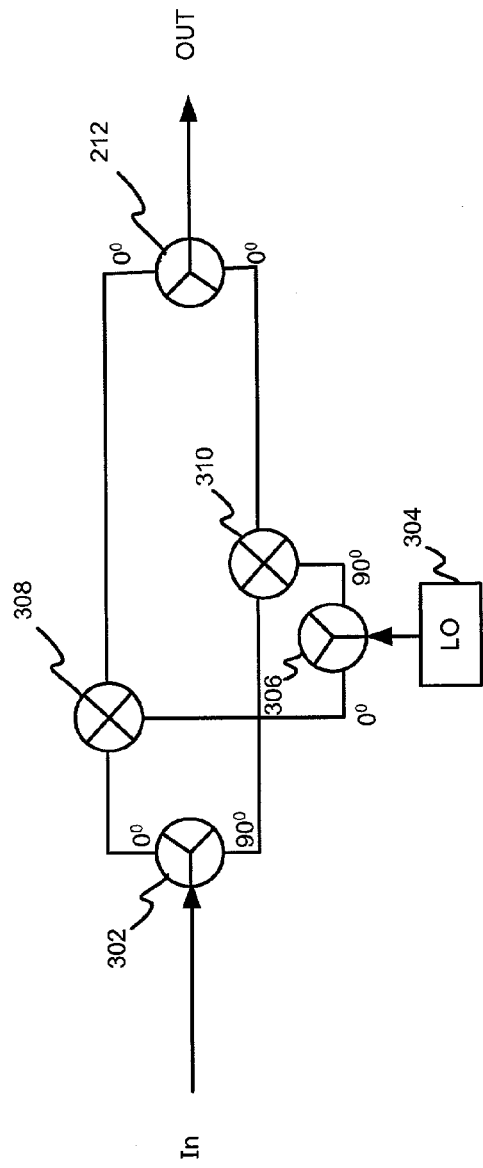
FIG. 3 is circuit block diagram of another alternative radio architecture that uses mixers to reject an image.
Figure 4:
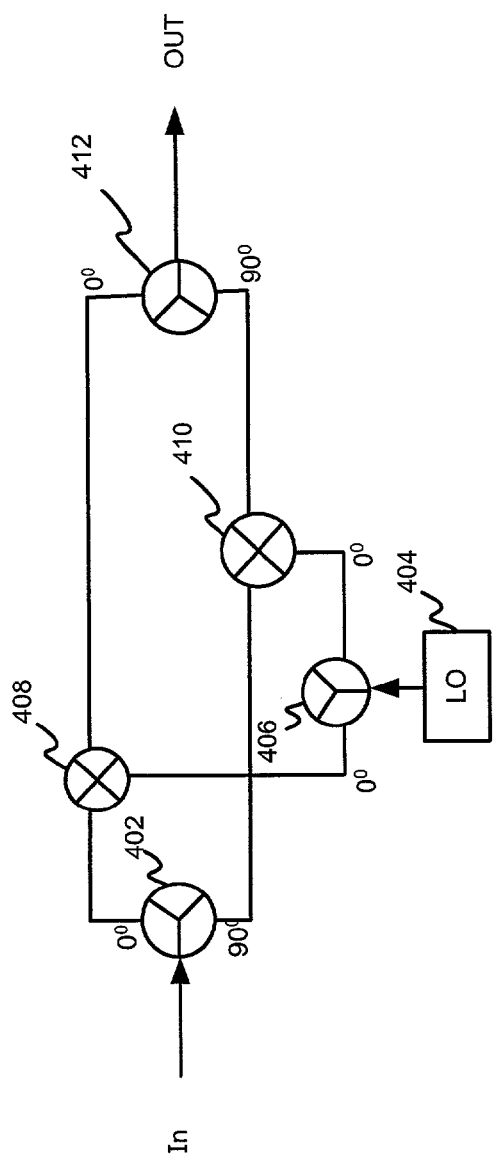
FIG. 4 is a circuit block diagram of still another alternative radio architecture that uses mixers to reject an image.

An alternative to using filters to remove the image (as shown in FIG. 1), is to use an image reject mixer. FIGS. 2–4, illustrate three configurations of image reject mixers. More particularly, FIG. 2 shows that an input signal is applied to an in-phase power splitter/combiner 202. A local oscillator 204 provides a signal to a quadrature power splitter/combiner 206, which in turn provides an in-phase signal to a mixer 208 and a quadrature signal to a mixer 210. Mixer 208 mixes an in-phase input signal with an in-phase local oscillator signal and provides an output to an in-phase input terminal of quadrature power splitter/combiner 212. Mixer 210 mixes an in-phase input signal with a quadrature local oscillator signal, and provides an output to a quadrature input terminal of quadrature power splitter/combiner 212, which provides an output signal.

FIG. 3 is circuit block diagram of another alternative radio architecture that uses mixers to reject an image. As shown, an input signal is applied to a quadrature power splitter/combiner 302. A local oscillator 304 provides a signal to a quadrature power splitter/combiner 306, which in turn provides an in-phase signal to a mixer 308 and a quadrature signal to a mixer 310. Mixer 308 mixes an in-phase input signal with an in-phase local oscillator signal and provides an output to a first in-phase input terminal of an in-phase power splitter/combiner 312. Mixer 310 mixes a quadrature input signal with a quadrature local oscillator signal, and provides an output signal to a second in-phase input terminal of in-phase power splitter/combiner 312, which provides an output signal.

FIG. 4 is a circuit block diagram of still another alternative radio architecture that uses mixers to reject an image. As shown, an input signal is applied to a quadrature power splitter/combiner 402. A local oscillator 404 provides a signal to an in-phase power splitter/combiner 406, which in turn provides an in-phase local oscillator signal to a mixer 408 and an in-phase local oscillator signal to a mixer 410. Mixer 408 mixes an in-phase input signal with an in-phase local oscillator signal and provides an output signal to an in-phase input terminal of a quadrature power splitter/combiner 412. Mixer 410 mixes a quadrature input signal with an in-phase local oscillator signal, and provides an output signal to a quadrature input terminal of quadrature power splitter/combiner 412, which provides an output signal.

Unfortunately, the alternative image reject mixer architectures shown in FIGS. 2–4 suffer from an important drawback with respect to implementation in integrated circuits. That is, in integrated circuits, making quadrature networks that maintain 90° over frequency, process, and temperature variations is difficult. Analog quadrature networks are degraded by component tolerances, temperature, component tracking issues versus temperature, manufacturing process variations, and so on. It may also be difficult to implement the required inductors and capacitors in a given manufacturing process for a passive quadrature network. It is noted that divide-by-two circuits, or dividers, as they are often referred to in this field, are substantially invariant to the above enumerated difficulties faced by analog quadrature networks. However, using divide-by-two circuits may result in placing stringent duty cycle requirements on an input clock signal, whereas using divide-by-four (or multiples of four) yield substantially perfect zero and ninety degree signals which are independent of input duty cycle.

Figure 5:
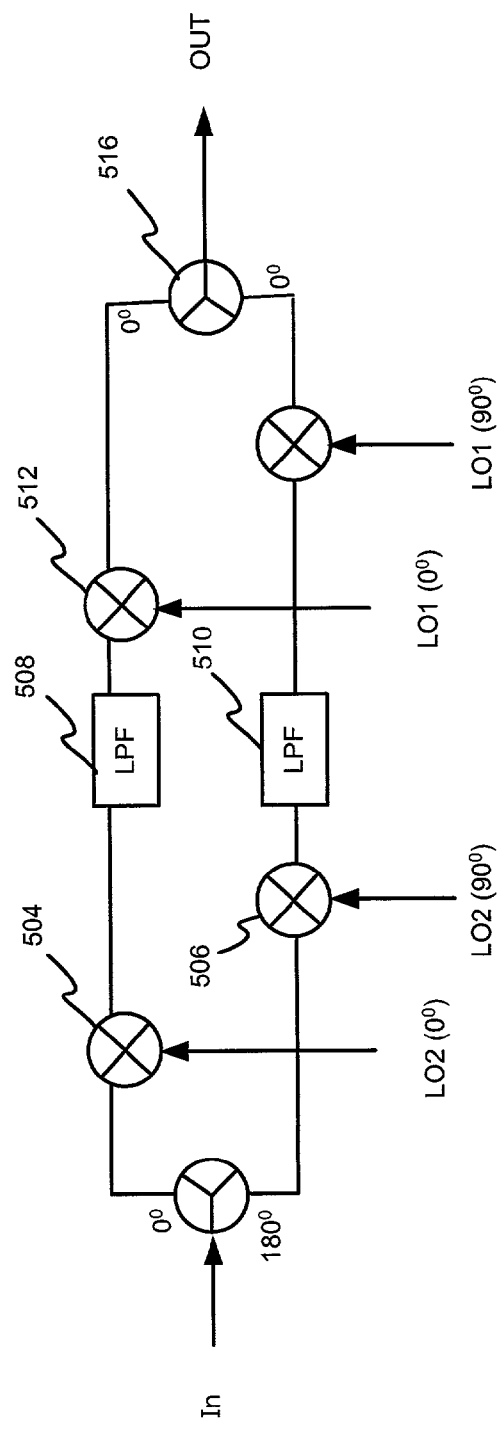
FIG. 5 is a circuit block diagram of a Weaver image reject mixer architecture having two local oscillators.

An alternative to the image reject architectures of FIGS. 2–4 is the "Weaver Image Reject Mixer" architecture which is shown in FIG. 5. More particularly, an input signal is provided to a power splitter/combiner 502 as shown in the figure, an in-phase local oscillator (LO2) signal is provided to a mixer 504, a quadrature local oscillator (LO2) signal is provided to a mixer 506, an in-phase local oscillator (LO1) signal is provided to a mixer 512, and a quadrature local oscillator (LO1) signal is provided to a mixer 514. Mixer 504 mixes an in-phase input signal with an in-phase LO2 signal which is low-pass filtered by filter 508, and that filtered signal is mixed at mixer 512 with an in-phase LO1 signal to produce an output signal which is provided to an input terminal of in-phase combiner 516. Mixer 506 mixes a 180°-phase input signal with a quadrature LO2 signal which is low-pass filtered by filter 510, and that filtered signal is mixed at mixer 514 with a quadrature LO1 signal to produce an output signal which is provided to an input terminal of in-phase combiner 516. Combiner 516 provides the desired output signal.

With respect to the architecture of FIG. 5, the 0° and 90° versions of the local oscillator signals can be generated digitally, and therefore, no quadrature networks are required. Unfortunately, the Weaver Image Reject Mixer of FIG. 5 requires two local oscillators, which usually implies two frequency synthesizers.

In accordance with the present invention, methods and apparatus for implementing image rejection in radio receivers or transmitters is based on a Weaver image reject mixer architecture that is modified such that only one local oscillator is used for the highest mixing frequency, and subsequent lower frequency mixing signals fed to the mixers are derived from digital frequency divider networks which produce both in-phase and quadrature versions of their pre-determined output frequencies. By using frequency dividers to generate these subsequent lower frequency signals, the intermediate frequencies walk; and when these frequency dividers are set to divide by multiples of two, generating quadrature signals becomes straightforward.

Figure 6:
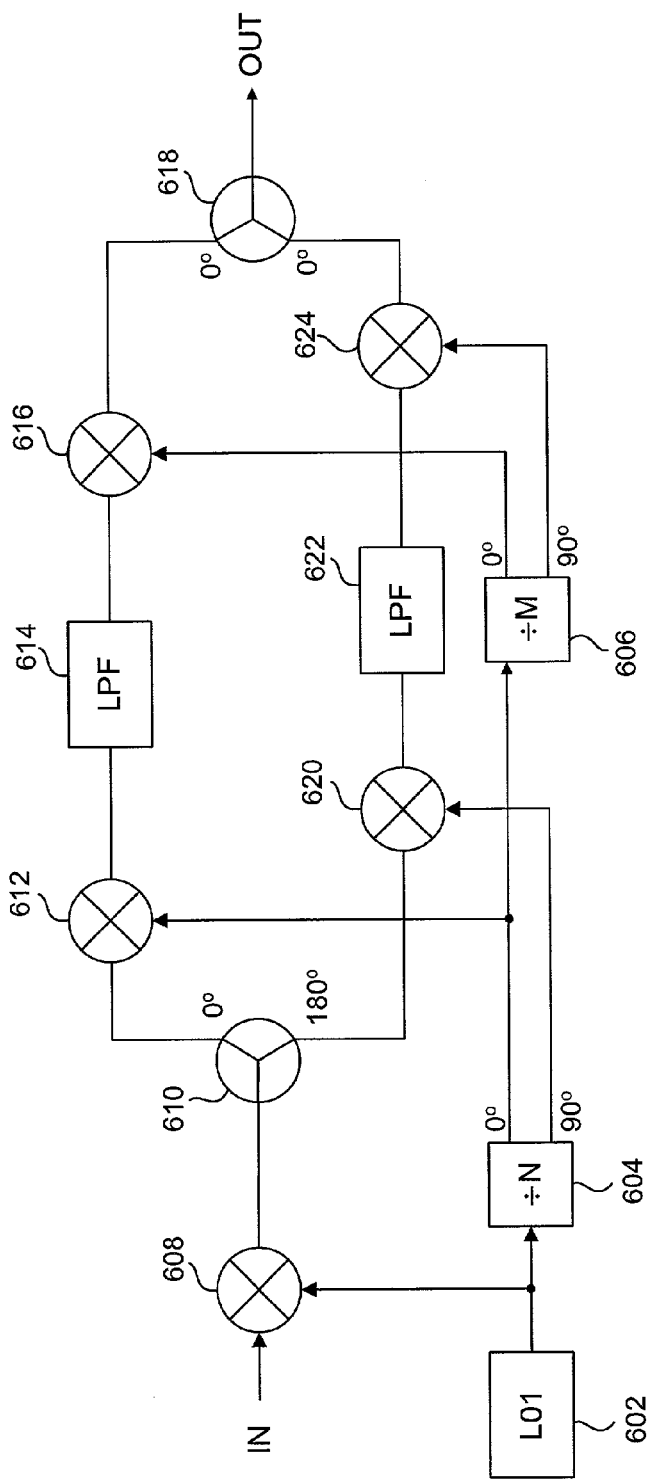
FIG. 6 is a general circuit block diagram, in accordance with the present invention, for implementing a "Walking Weaver" image reject mixer architecture that uses a single local oscillator.

Referring to FIG. 6, an image reject circuit architecture in accordance with the present invention is shown. More particularly, a local oscillator 602, operable to produce an output signal at a particular frequency or range of frequencies, is coupled to a divide-by-N stage 604, such that, in operation, divide-by-N stage 604 receives, at its input terminal, the output signal of local oscillator 602. Divide-by-N 604 is operable to produce at least two divide-by-N output signals, the first output signal being a divided-by-N version of the local oscillator output signal, and the second also being a divided-by-N version of the local oscillator output signal, but shifted 90° with respect to the first output signal. A divide-by-M stage 606 is coupled to divide-by-N stage 604 such that divide-by-M 606, in operation, receives at its input terminal, a divided-by-N version of the local oscillator output signal. Divide-by-M 606 is operable to produce at least two divide-by-M output signals, the first divide-by-M output signal being a divided-by-M version of the divided-by-N output signal, and the second also being a divided-by-M version of the divided-by-N output signal, but shifted 90° with respect to the first divided-by-M output signal. It is noted that rather than coupling a divide-by-M stage to receive an input signal from the divide-by-N stage, an alternative arrangement provides a divide-by-NM stage coupled to receive an input signal from the local oscillator.

Still referring to FIG. 6, a mixer 608 has a first input terminal coupled to local oscillator 602 such that, in operation, it receives the local oscillator output signal. Mixer 608 has a second input terminal, which in operation, is coupled to an input signal source; and has an output terminal coupled to an input terminal of a splitter 610. A mixer 612 has a first input terminal coupled to a first output terminal of splitter 610, a second input terminal coupled to an in-phase output terminal of divide-by-N 604, and an output terminal which is coupled to a filter 614 (a low-pass filter in this illustrative embodiment). A mixer 616 has a first input terminal coupled to filter 614, a second input terminal coupled to an in-phase output terminal of divide-by-M 606, and an output terminal. An in-phase power combiner 618 has a first input terminal coupled to the output terminal of mixer 616.

Still referring to FIG. 6, a mixer 620 has a first input terminal coupled to the second output terminal of splitter 610, a second input terminal coupled to a quadrature output of divide-by-N 604, and an output terminal coupled to filter 622 (a low-pass filter in this illustrative embodiment). A mixer 624 has a first input terminal coupled to filter 622, a second input terminal coupled to a quadrature output terminal of divide-by-M 606, and an output terminal. Combiner 618 has a second input terminal coupled to the output terminal of mixer 624, and an output terminal as shown in FIG. 6.

It should be noted that in the illustrative example of FIG. 6, power splitter/combiner 610 has a 0 degree output terminal and a 180 degree output terminal as shown in the figure, while power splitter/combiner 618 is "in-phase", that is having both of its input terminals as 0 degree input terminals. In an alternative arrangement, an in-phase power splitter/combiner can be used at the input end of the Walking Weaver circuit illustrated, with a 0 degree/180 degree power splitter/combiner used at the output end of the circuit.

Figure 7:
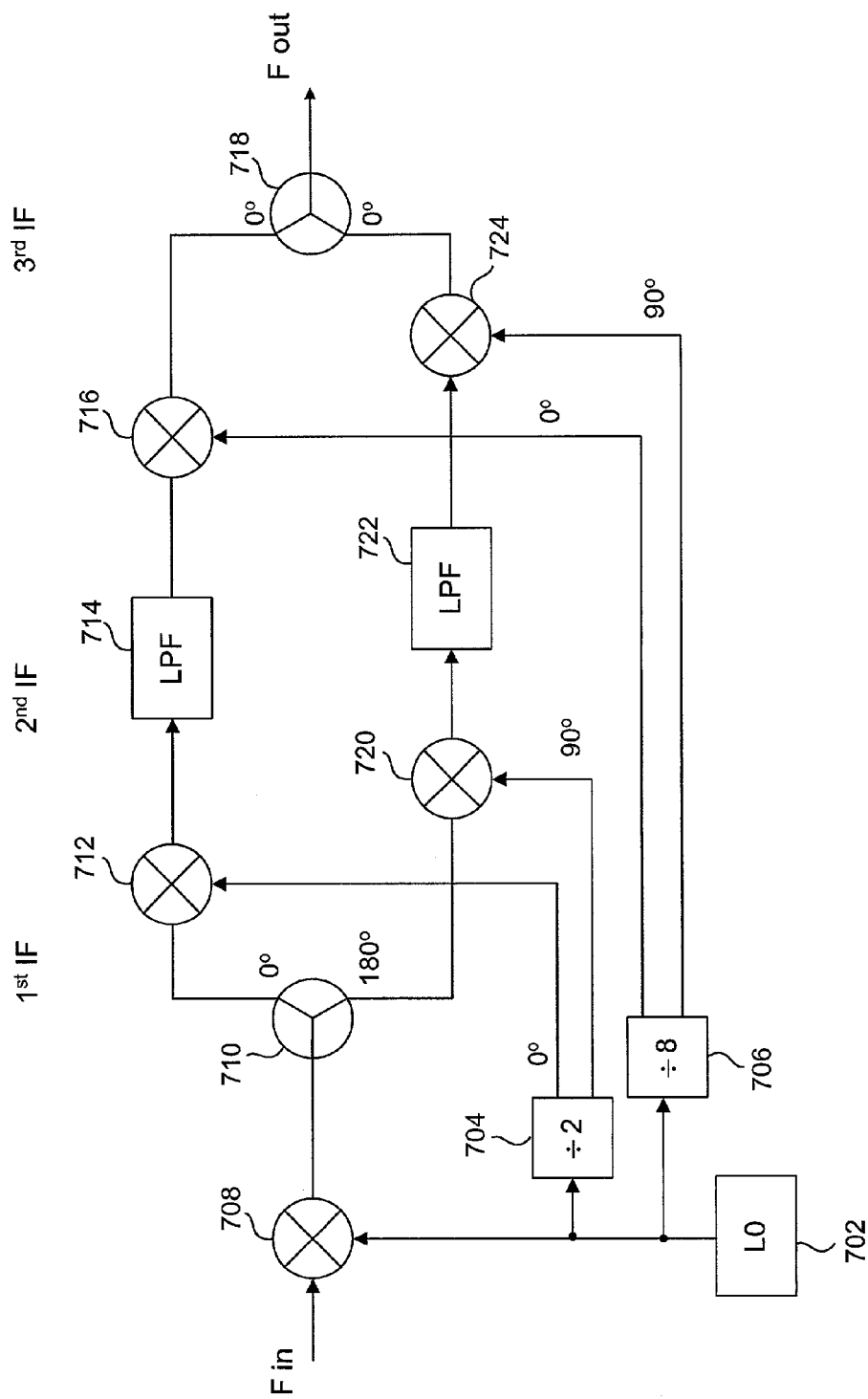
FIG. 7 is a circuit block diagram in accordance with the present invention of a first illustrative embodiment of a Walking Weaver image reject mixer.

FIG. 7 is a circuit block diagram, in accordance with the present invention, of an illustrative embodiment of a Walking Weaver image reject mixer for a receiver. The example of FIG. 7 illustrates a receiver downconverter with image rejection that downconverts from an input frequency range of 5.15 GHz to 5.825 GHz, to output a 90 MHz third IF signal. Architecturally, the circuit of FIG. 7 is very similar to that of FIG. 6, but includes some specifics with respect to the divider networks and the input and output frequencies. In the circuit of FIG. 7, to achieve the downconversion of signals having a frequency in the range of 5.15 GHz to 5.825 GHz to an intermediate frequency of 90 MHz with image rejection, the local oscillator frequency is chosen in accordance with the following relationship: Fin−L−L/2−L/8=90 MHz, where Fin is the input frequency, L is the local oscillator frequency, and 2 and 8 are the divider values selected by the designer. This relationship, based on the circuit block diagram of FIG. 7, can be rearranged to solve for the local oscillator frequency as follows: (8(Fin−90 MHz))/13 GHz=L. Table I, below, shows the numerical relationship between Fin, L, the first intermediate frequency ($1^{st}$ IF), L/2, the second intermediate frequency ($2^{nd}$ IF), L/8, and the third intermediate frequency ($3^{rd}$ IF) in this illustrative example.

TABLE 1

| Fin (MHz) | LO (MHz) | $1^{st}$ IF (MHz) | LO/2 (MHz) | $2^{nd}$ IF (MHz) | LO/8 (MHz) | $3^{rd}$ IF (MHz) |
| --- | --- | --- | --- | --- | --- | --- |
| 5150.000 | 3113.846 | 2036.154 | 1556.923 | 479.231 | 389.231 | 90.000 |
| 5200.000 | 3144.615 | 2055.385 | 1572.308 | 483.077 | 393.077 | 90.000 |
| 5250.000 | 3175.385 | 2074.615 | 1587.692 | 486.923 | 396.923 | 90.000 |
| 5300.000 | 3206.154 | 2093.846 | 1603.077 | 490.769 | 400.769 | 90.000 |
| 5350.000 | 3236.923 | 2113.077 | 1618.462 | 494.615 | 404.615 | 90.000 |
| 5400.000 | 3267.692 | 2132.308 | 1633.846 | 498.462 | 408.462 | 90.000 |
| 5450.000 | 3298.462 | 2151.538 | 1649.231 | 502.308 | 412.308 | 90.000 |
| 5500.000 | 3329.231 | 2170.769 | 1664.615 | 506.154 | 416.154 | 90.000 |
| 5550.000 | 3360.000 | 2190.000 | 1680.000 | 510.000 | 420.000 | 90.000 |
| 5600.000 | 3390.769 | 2209.231 | 1695.385 | 513.846 | 423.846 | 90.000 |
| 5650.000 | 3421.538 | 2228.462 | 1710.769 | 517.692 | 427.692 | 90.000 |
| 5700.000 | 3452.308 | 2247.692 | 1726.154 | 521.538 | 431.538 | 90.000 |
| 5750.000 | 3483.077 | 2266.923 | 1741.538 | 525.385 | 435.385 | 90.000 |
| 5800.000 | 3513.846 | 2286.154 | 1756.923 | 529.231 | 439.231 | 90.000 |
| 5850.000 | 3544.615 | 2305.385 | 1772.308 | 533.077 | 443.077 | 90.000 |

It is noted that the relationship between the input frequency, local oscillator frequency, the intermediate frequencies and the divided down frequencies of the digital quadrature signal generation circuitry can be expressed more generally as: Fin−L−L/N−L/NM=IF3, where N and M are integers greater than 1, and IF3 is the desired $3^{rd}$ intermediate frequency. N and M are preferably multiples of 2. This is extensible such that a different number of intermediate frequencies are generated.

As shown in FIG. 7, a local oscillator 702, operable to produce an output signal at a particular frequency or range of frequencies, is coupled to a divide-by-2 704, such that, in operation, divide-by-2 704 receives, at its input terminal, the output signal of local oscillator 702. Divide-by-2 704 is operable to produce a first output signal, which is a divided-by-2 version of the local oscillator output signal, and a second output signal which is a 90° phase-shifted version of its first output signal. A divide-by-8 706 is coupled to local oscillator 702 such that divide-by-8 706, in operation, receives the local oscillator output signal at its input terminal. Divide-by-8 706 is operable to produce an output signal which is a divided-by-8 version of the local oscillator signal, and a second signal which is a 90° phase-shifted version of its first output signal.

Still referring to FIG. 7, a mixer 708 has a first input terminal coupled to local oscillator 702 such that, in operation, it receives the local oscillator output signal. Mixer 708 has a second input terminal, which in operation, is coupled to an input signal source; and has an output terminal coupled to communicate the first intermediate frequency to an input terminal of a 0°/180° power splitter 710. A mixer 712 has a first input terminal coupled to a first output terminal of splitter 710, a second input terminal coupled to an in-phase output terminal of divide-by-2 704, and an output terminal which is coupled to communicate the second intermediate frequency to low-pass filter 714. A mixer 716 has a first input terminal coupled to filter 714, a second input terminal coupled to an in-phase output of divide-by-8 706, and an output terminal. An in-phase power combiner 718 has a first input terminal coupled to the output terminal of mixer 716. A mixer 720 has a first input terminal coupled to the second output terminal of splitter 710, a second input terminal coupled to a quadrature output of divide-by-2 704, and an output terminal coupled to low-pass filter 722. A mixer 724 has a first input terminal coupled to filter 722, a second input terminal coupled to a quadrature output terminal of divide-by-8 706, and an output terminal. Combiner 718 has a second input terminal coupled to the output terminal of mixer 724, and an output terminal as shown in FIG. 7.

Figure 8:
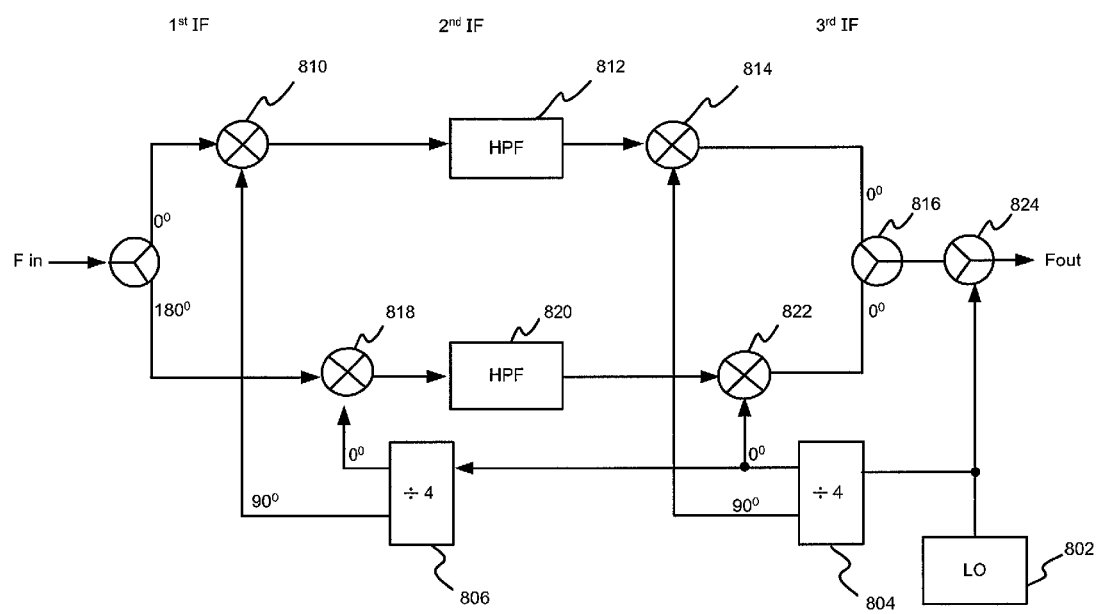
FIG. 8 is a circuit block diagram in accordance with the present invention of a second illustrative embodiment of a Walking Weaver image reject mixer.

FIG. 8 is a circuit block diagram in accordance with the present invention of an illustrative embodiment of a Walking Weaver image reject mixer for a transmitter. The example of FIG. 8 illustrates a transmitter upconverter with image rejection that upconverts from a transmit baseband frequency of 140 MHz to a transmitter output frequency in a range of 5.15 GHz to 5.825 GHz. In this embodiment, the local oscillator frequency is chosen in accordance with the following relationship: Fout−L−L/4−L/16=140 MHz, where Fout is the transmitter output frequency, L is the local oscillator frequency, and 4 and 16 are the divider values chosen by the designer. This relationship, based on the circuit block diagram of FIG. 8, can be rearranged to solve for the local oscillator frequency as follows: L=(16(Fout−140 MHz))/21 GHz. Table II, below, shows the numerical relationship between Fout, L, the third intermediate frequency ($3^{rd}$ IF), L/4, the second intermediate frequency ($2^{nd}$ IF), L/16, and the first intermediate frequency ($1^{st}$ IF).

TABLE 2

| First IF | LO/16 (MHz) | $2^{nd}$ IF (MHz) | LO/4 (MHz) | $3^{rd}$ IF (MHz) | LO (MHz) | Fout (MHz) |
|---|---|---|---|---|---|---|
| 140.000 | 238.571 | 378.571 | 954.286 | 1332.857 | 3817.143 | 5150 |
| 140.000 | 240.952 | 380.952 | 963.810 | 1344.762 | 3855.238 | 5200 |
| 140.000 | 243.333 | 383.333 | 973.333 | 1356.667 | 3893.333 | 5250 |
| 140.000 | 245.714 | 385.714 | 982.857 | 1368.571 | 3931.429 | 5300 |
| 140.000 | 248.095 | 388.095 | 992.381 | 1380.476 | 3969.524 | 5350 |
| 140.000 | 250.476 | 390.476 | 1001.905 | 1392.381 | 4007.619 | 5400 |
| 140.000 | 252.857 | 392.857 | 1011.429 | 1404.286 | 4045.714 | 5450 |
| 140.000 | 255.238 | 395.238 | 1020.952 | 1416.190 | 4083.810 | 5500 |
| 140.000 | 257.619 | 397.619 | 1030.476 | 1428.095 | 4121.905 | 5550 |
| 140.000 | 260.000 | 400.000 | 1040.000 | 1440.000 | 4160.000 | 5600 |
| 140.000 | 262.381 | 402.381 | 1049.524 | 1451.905 | 4198.095 | 5650 |
| 140.000 | 264.762 | 404.762 | 1059.048 | 1463.810 | 4236.190 | 5700 |
| 140.000 | 267.143 | 407.143 | 1068.571 | 1475.714 | 4274.286 | 5750 |
| 140.000 | 269.524 | 409.524 | 1078.095 | 1487.619 | 4312.381 | 5800 |
| 140.000 | 271.905 | 411.905 | 1087.619 | 1499.524 | 4350.476 | 5850 |

It is noted that the relationship between the input frequency, local oscillator frequency, the intermediate frequencies and the divided down frequencies of the digital quadrature signal generation circuitry can be expressed more generally as: Fout−L−L/N−L/NM=IF1, where N and M are integers greater than 1, and IF1 is the transmit baseband frequency. N and M are preferably multiples of 2. This is extensible such that a different number of intermediate frequencies are generated.

As shown in FIG. 8, a local oscillator 802 generates an output signal that is coupled to a divide-by-four circuit 804. Divide-by-4 804 produces an in-phase and quadrature pair of signals at one-fourth the frequency of local oscillator 802. The in-phase output terminal of divide-by-4 804 is coupled to an input terminal of a divide-by-4 806. Divide-by-4 806 produces an in-phase and quadrature pair of signals at one-fourth the frequency of divide-by-4 804 (i.e., the local oscillator frequency divided-by-16). In operation, an input terminal of a 0°/180° power splitter 808 is coupled to a transmit baseband signal source (not shown). A mixer 810 mixes the in-phase transmit baseband signal with a quadrature divided-by-16 local oscillator signal to produce an output that is communicated to high-pass filter 812. A mixer 814 mixes the output of high-pass filter 812 with a quadrature divided-by-4 local oscillator signal to produce an output signal that is coupled an input terminal of an in-phase power combiner 816. A mixer 818 mixes the 180° transmit baseband signal with an in-phase divided-by-16 local oscillator signal to produce an output that is communicated to high-pass filter 820. A mixer 822 mixes the output of high-pass filter 820 with an in-phase divided-by-4 local oscillator signal to produce an output signal that is coupled an input terminal of in-phase power combiner 816. The output terminal of combiner 816 is coupled to an input terminal of mixer 824 where it is mixed with the output of the local oscillator. The output of mixer 824 is the transmitter output signal.

Figure 9:
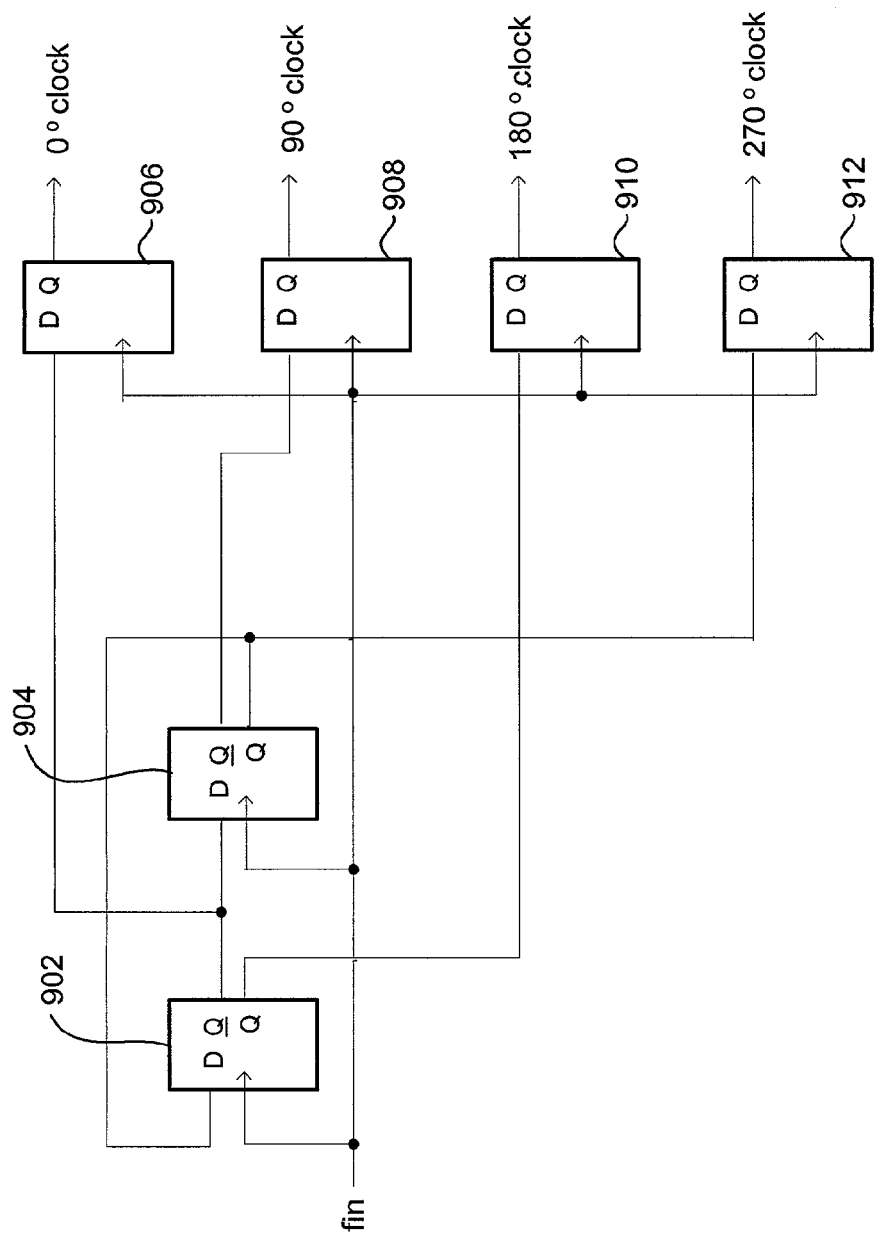
FIG. 9 is a schematic diagram of a circuit that may be used for generating quadrature clock signals based on a divide by four arrangement.

FIG. 9 is a schematic diagram of a circuit that may be used for generating quadrature clock signals based on a divide by four arrangement. This exemplary circuit includes six positive-edge triggered D-type flip flops (DFF) 902, 904, 906, 908, 910 and 912. As shown in the figure, all six clock inputs are coupled to a common signal, Fin. The Q output terminal of DFF 902 is coupled to the D input terminal of DFF 904, and is further coupled to the D input terminal of DFF 906. The Q-bar output terminal of DFF 902 is coupled to the D input terminal of DFF 910. The Q output terminal of DFF 904 is coupled to the D input terminal of DFF 908. The Q-bar output of DFF 904 is coupled to the D input of DFF 902, and to the D input of DFF 912. In operation, DFFs 906, 908, 910, and 912 each produce a signal having a frequency that is one-fourth of the frequency of Fin, and having a phase relationship wherein the Q output of DFF 908 is delayed 90° from the Q output of DFF 906; the Q output of DFF 910 is delayed 180° from the Q output of DFF 906; and the Q output of DFF 912 is delayed 270° from the Q output of DFF 906.

Figure 10:
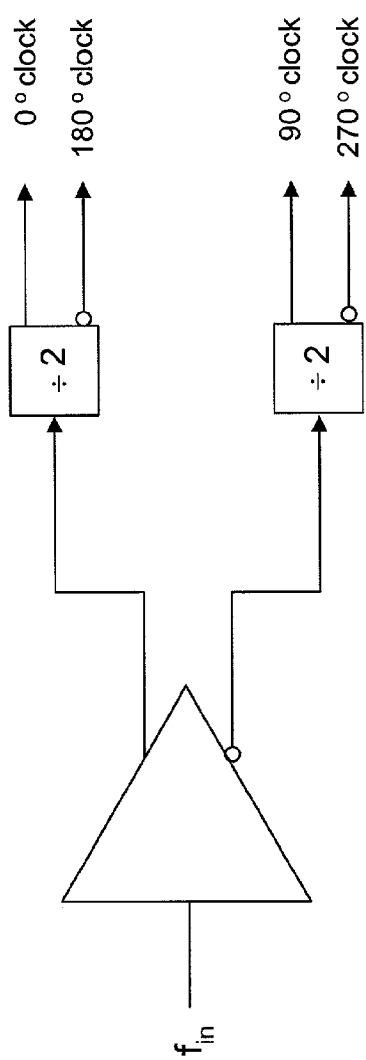
FIG. 10 is schematic diagram of a circuit that may be used for generating quadrature clock signals based on a divide by two arrangement.

FIG. 10 is schematic diagram of a circuit that may be used for generating quadrature clock signals based on a divide by two arrangement. As shown in the figure, an input signal, Fin, is applied to a buffer 1002 which produces a differential output pair. The non-inverted output terminal of buffer 1002 is coupled to a divide-by-two circuit 1004 having both a true output terminal and an inverted output terminal; and the inverted output terminal of buffer 1002 is coupled to a divide-by-two circuit 1006. In operation, the true output terminal of divide-by-two 1004 provides an in-phase version of Fin/2, while the inverted output terminal of divide-by-two 1004 provides a 180° delayed version of Fin/2. Similarly, the true output terminal of divide-by-two 1006 provides an 90° delayed version of Fin/2, while the inverted output terminal of divide-by-two 1006 provides a 270° delayed version of Fin/2.

CONCLUSION

Thus, it can be seen from the above descriptions, that methods and apparatus for image rejection in radios have been described.

An advantage of some embodiments of the present invention is that, no quadrature networks are required.

Still other advantages of some embodiments of the present invention are that, because only one phase-locked loop is used instead of two, three, or more, reductions in power consumption, reductions in chip size, reductions of spurious intermodulation products, and reductions of unwanted coupling are achieved.

Various embodiments of the present invention may be implemented as circuit-based processes, including implementation on a single integrated circuit. As would be apparent to one skilled in the art, various functions of circuit elements may also be implemented as processing operations in a software program. Such software may be employed in, for example, a digital signal processor, micro-controller, or general-purpose computer. Some aspects of the present invention relate to signal processing which can also be implemented as, or simulated or emulated by programs code being executed by a computational resource such as, but not limited to a computer.

The present invention can be embodied in the form of methods and apparatuses for practicing those methods. The present invention can also be embodied in the form of program code embodied in tangible media, such as punched cards, magnetic tape, floppy disks, hard disk drives, CD-ROMs, flash memory cards, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific circuit elements.

While the present invention has been described in terms of the above-described embodiments, those skilled in the art will recognize that the invention is not limited to the embodiments described. The present invention can be practiced with modification and alteration within the spirit and scope of the appended claims. Thus, the description is to be regarded as illustrative of, rather than restrictive on, the present invention.

What is claimed is:

1. A method of downconverting a signal and rejecting an image, comprising: providing a first, second, third, fourth and fifth signal, wherein the first signal has a frequency F, the second signal has a frequency F/N, wherein N is an integer greater than 1, the third signal has a frequency F/N, wherein N is an integer greater than 1, and is phase shifted 90° with respect the second signal; the fourth signal has a frequency F/NM, wherein N and M are integers greater than 1, and the fifth signal has a frequency F/NM, wherein N and M are integers greater than 1, and is phase shifted 90.degree. from the fourth signal; mixing the first signal with an input signal to produce a first mixer output signal; splitting the first mixer output signal to produce a first splitter output signal and a second splitter output signal; mixing the first splitter output signal with the second signal to produce a second mixer output signal; mixing the second splitter output signal with the third signal to produce a third mixer output signal; mixing the second mixer output signal with the fourth signal to produce a fourth mixer output signal; mixing the third mixer output signal with the fifth signal to produce a fifth mixer output signal; and combining the fourth mixer output signal and the fifth mixer output signal to produce a combiner output signal.

2. The method of claim 1, wherein mixing the first splitter output signal with the second signal to produce a second mixer output signal further comprises low-pass filtering.

3. The method of claim 2, wherein mixing the second splitter output signal with the third signal to produce a third mixer output signal further comprises low-pass filtering.

4. The method of claim 1, wherein N and M are each multiples of 2.

5. The method of claim 3, wherein providing the second, third, fourth, and fifth signals comprises digitally dividing the first signal.

6. The method of claim 4, wherein N equals 2 and M equals 4.

7. The method of claim 3, wherein F is a frequency in the range of 3.113 GHz to 3.545 GHz.

8. The method of claim 7, wherein the input signal has a frequency in the range of 5.15 GHz to 5.825 GHz.

9. The method of claim 8, wherein the combiner output signal has a frequency of 90 MHz.

10. A method of upconverting a signal, and rejecting an image, comprising: providing a first, second, third, fourth and fifth signal, wherein the first signal has a frequency F, the second signal has a frequency F/N, wherein N is an integer greater than 1, the third signal has a frequency F/N, wherein N is an integer greater than 1, and is phase shifted 90° with respect the second signal; the fourth signal has a frequency F/NM, wherein N and M are integers greater than 1, and the fifth signal has a frequency F/NM, wherein N and M are integers greater than 1, and is phase shifted 90° from the fourth signal; splitting an input signal to produce a first splitter output signal a and second splitter output signal; mixing the first splitter output signal with the fifth signal to produce a first mixer output signal; mixing the second splitter output signal with the fourth signal to produce a second mixer output signal; high-pass filtering the first mixer output signal and the second mixer output signal to produce, respectively a first filter output and a second filter output; mixing the first filter output with the third signal to produce a third mixer output signal; mixing the second filter output with the second signal to produce a fourth mixer output signal; combining the third mixer output signal and the fourth mixer output signal to produce combiner output signal; and mixing the combiner output signal with the first signal to produce a transmitter output signal.

11. The method of claim 10, wherein N and M are each multiples of 2.

12. The method of claim 10, wherein providing the second, third, fourth, and fifth signals comprises digitally dividing the first signal.

13. The method of claim 11, wherein N and M each equal 4.

14. A method of rejecting an image, comprising: mixing an input signal with a local oscillator signal to produce a first intermediate frequency signal; splitting the first intermediate frequency signal into a first part and a second part; mixing the first part with a first clock signal to produce a first second-intermediate-frequency signal, and mixing the second part with a second clock signal, to produce a second second-intermediate-frequency signal; filtering the first and second second-intermediate-frequency signals; mixing the filtered first second-intermediate-frequency signal with a third clock signal to produce a first third-intermediate-frequency signal, and mixing the filtered second second-intermediate-frequency signal with a fourth clock signal to produce a second third-intermediate-frequency signal; and combining the first third-intermediate-frequency signal with the second third-intermediate-frequency signal to produce an output signal; wherein the first and second clock signals have a frequency that is less than that of the local oscillator by a factor of N, wherein N is an integer greater than 1, and the second clock signal is phase shifted 90° from the first clock signal, the third and fourth clock signals have a frequency that is less than that of the local oscillator by a factor of NM, wherein N and M are integers greater than 1, and the fourth clock signal is phase shifted 90° from the third clock signal.

15. The method of claim 14, wherein N is a multiple of 2.

16. The method of claim 14, wherein M is a multiple of 2.

17. The method of claim 14, wherein N and M are each a multiple of 2.

18. The method of claim 14, wherein the image is rejected in a receiver.

19. The method of claim 14, wherein the image is rejected in a receiver, N and M are each a multiple of 2, and the filtering comprises low-pass filtering.

20. A method of rejecting an image, comprising: splitting a transmit baseband signal into a first part and a second part; mixing the first part with a first clock signal to produce a first second-intermediate-frequency signal, and mixing the second part with a second clock signal, to produce a second second-intermediate-frequency signal; high-pass filtering the first second-intermediate-frequency signal, and high-pass filtering the second second-intermediate-frequency signal; mixing the high-pass filtered first second-intermediate-frequency signal with a third clock signal to produce a first third-intermediate-frequency signal, and mixing the high-pass filtered second second-intermediate-frequency signal with a fourth clock signal to produce a second third-intermediate-frequency signal; combining the first third-intermediate-frequency signal with the second third-intermediate-frequency signal to produce a combined signal; and mixing the combined signal with a local oscillator signal to produce a transmit output signal; wherein the first and second clock signals have a frequency that is less than that of the local oscillator by a factor of NM, wherein N and M are integers greater than 1, and the second clock signal is phase shifted 90° from the first clock signal, the third and fourth clock signals have a frequency that is less than that of the local oscillator by a factor of N, wherein N is an integer greater than 1, and the fourth clock signal is phase shifted 90° degrees from the third clock signal.

21. The method of claim 20, wherein N and M are multiples of 2.

22. The method of claim 21, wherein the second part of the split transmit baseband signal is phase-shifted 180 degrees from the first part of the split transmit baseband signal.

23. An image rejection circuit, comprising: a local oscillator, a first divider coupled to the local oscillator, and a second divider coupled to the first divider network; a first mixer having a first and second input terminals, and an output terminal; a first splitter having an input terminal coupled to the output terminal of the first mixer, and having a first and a second splitter output terminal; a second mixer having a first input terminal coupled to the first output terminal of the first splitter, a second input terminal coupled to an in-phase output terminal of the first divider, and having an output terminal; a third mixer having a first input terminal coupled to the second output terminal of the first splitter, a second input terminal coupled to a quadrature-phase output terminal of the first divider, and having an output terminal; a first filter coupled to the second mixer output terminal, and a second filter coupled to the third mixer output terminal; a fourth mixer having a first input terminal coupled to the first filter, a second input terminal coupled to an in-phase output terminal of the second divider, and having an output terminal; a fifth mixer having a first input terminal coupled to the second filter, a second input terminal coupled to a quadrature-phase output terminal of the second divider, and having an output terminal; and a combiner having a first input terminal coupled to the output terminal of the fourth mixer, a second input terminal coupled to the output terminal of the fifth mixer, and having an output terminal.

24. The circuit of claim 24, wherein the in-phase and quadrature-phase output terminals of the first divider are adapted to provide signals that are phase shifted 90. degree. from each other.

25. The circuit of claim 24, wherein the in-phase and quadrature-phase output terminals of the first divider are adapted to provide signals that are the same frequency as each other, and that frequency is less than that of the local oscillator by a first factor which is a multiple of 2.

26. The circuit of claim 25, wherein the in-phase and quadrature-phase output terminals of the second divider are adapted to provide signals that are the same frequency as each other, and that frequency is less than that of the local oscillator by a second factor which is a multiple of 2.

27. The circuit of claim 26, wherein the second factor is greater than the first factor.

28. The circuit of claim 23, wherein the first filter and the second filter are each low-pass filters.

29. The circuit of claim 23, wherein the first input terminal of the first mixer is coupled to an input signal source.

30. The circuit of claim 29, wherein the second input terminal of the first mixer is coupled to the local oscillator.

31. An image rejection circuit, comprising: a local oscillator, a first divider coupled to the local oscillator, and a second divider coupled to the first divider; a first splitter having an input terminal coupled to an input signal source, a first output terminal and a second output terminal; a first mixer having a first input terminal coupled to the first output terminal of the first splitter, a second input terminal coupled to a second output terminal of the second divider, and an output terminal; a first high-pass filter coupled to the output terminal of the first mixer; a second mixer having a first input terminal coupled to the second output terminal of the first splitter, a second input terminal coupled to a first output terminal of the second divider, and an output terminal; a second high-pass filter coupled to the output terminal of the second mixer; a third mixer having a first input terminal coupled to first high-pass filter, a second input terminal coupled to a second output terminal of the first divider, and an output terminal; a fourth mixer having a first input terminal coupled to the second filter, a second input terminal coupled to a first output terminal of the first divider, and having an output terminal; a combiner having a first input terminal coupled to the output terminal of the third mixer, a second input terminal coupled to the output terminal of the fourth mixer, and an output terminal; and a fifth mixer having a first input terminal coupled to the output terminal of the combiner, a second input terminal coupled to an output of the local oscillator, and having an output terminal.

32. The circuit of claim 31, wherein the input terminal of the first splitter is coupled to an input signal source.

33. The circuit of claim 31, wherein the input terminal of the first splitter is coupled to a transmit baseband signal source.

34. The circuit of claim 31, wherein the first divider and the second divider each divide by factor wherein the factor is a multiple of 2.

35. An image rejection circuit, comprising: a local oscillator, a first divider coupled to the local oscillator, and a second divider coupled to the local oscillator; a first mixer having two input terminals and an output terminal; a first splitter having an input terminal coupled to the output terminal of the first mixer, and having a first and a second splitter output terminal; a second mixer having a first input terminal coupled to the first output terminal of the first splitter, a second input terminal coupled to an in-phase output terminal of the first divider, and having an output terminal; a third mixer having a first input terminal coupled to the second output terminal of the first splitter, a second input terminal coupled to a quadrature-phase output terminal of first divider, and having an output terminal; a first filter coupled to the second mixer output terminal, and a second filter coupled to the third mixer output terminal; a fourth mixer having a first input terminal coupled to the first filter, a second input terminal coupled to an in-phase output terminal of the second divider, and having an output terminal; a fifth mixer having a first input terminal coupled to the second filter, a second input terminal coupled to a quadrature-phase output terminal of the second divider, and having an output terminal; and a combiner having a first input terminal coupled to the output terminal of the fourth mixer, a second input terminal coupled to the output terminal of the fifth mixer, and having an output terminal.

36. The circuit of claim 35, wherein the first divider and the second divider each divide by factor wherein the factor is a multiple of 2.

37. An image rejection circuit, comprising: a local oscillator, a first divider coupled to the local oscillator, and a second divider coupled to the local oscillator; a first splitter having an input terminal coupled to an input signal source, a first output terminal and a second output terminal; a first mixer having a first input terminal coupled to the first output terminal of the first splitter, a second input terminal coupled to a second output terminal of the second divider, and an output terminal; a first high-pass filter coupled to the output terminal of the first mixer; a second mixer having a first input terminal coupled to the second output terminal of the first splitter, a second input terminal coupled to a first output terminal of the second divider, and an output terminal; a second high-pass filter coupled to the output terminal of the second mixer; a third mixer having a first input terminal coupled to first high-pass filter, a second input terminal coupled to a second output terminal of the first divider, and an output terminal; a fourth mixer having a first input terminal coupled to the second filter, a second input terminal coupled to a first output terminal of the first divider, and having an output terminal; a combiner having a first input terminal coupled to the output terminal of the third mixer, a second input terminal coupled to the output terminal of the fourth mixer, and an output terminal; and a fifth mixer having a first input terminal coupled to the output terminal of the combiner, a second input terminal coupled to an output of the local oscillator, and having an output terminal.

38. The circuit of claim 37, wherein the first divider and the second divider each divide by factor wherein the factor is a multiple of 2.

* * * * *